United States Patent [19]

Sirinyan et al.

[11] Patent Number: 5,108,823
[45] Date of Patent: Apr. 28, 1992

[54] PROCESS FOR THE METALLIZATION OF MOLDINGS OF POLYARYLENE SULFIDES

[75] Inventors: Kirkor Sirinyan, Bergisch Gladbach; Karl-Heinz Köhler, Krefeld; Klaus Reinking, Wermelskirchen; Wolfgang Rüsseler; Wolfgang Wehnert, both of Krefeld, all of Fed. Rep. of Germany

[73] Assignee: Bayer Aktiengesellschaft, Leverkusen, Fed. Rep. of Germany

[21] Appl. No.: 459,983

[22] Filed: Jan. 2, 1990

[30] Foreign Application Priority Data

Jan. 14, 1989 [DE] Fed. Rep. of Germany ....... 3901029

[51] Int. Cl.⁵ .............................................. C23C 26/00
[52] U.S. Cl. .................................. 428/209; 428/411.1; 428/901; 427/98; 427/306
[58] Field of Search ................... 427/98, 306; 428/209, 428/411.1, 901

[56] References Cited

U.S. PATENT DOCUMENTS

| 3,937,857 | 2/1976 | Brummett | 427/306 |
| 4,188,415 | 2/1980 | Takahashi | 427/98 |
| 4,303,798 | 12/1981 | Paunovic | 427/98 |
| 4,447,471 | 5/1984 | Putt | 427/98 |
| 4,486,463 | 12/1984 | Rubner | 427/306 |
| 4,532,015 | 7/1985 | Boultinghouse | 427/306 |
| 4,575,467 | 3/1986 | Sirinyan | 427/306 |
| 4,746,536 | 5/1988 | Ichikawa | 427/98 |
| 4,794,164 | 12/1988 | Iwasaki | 525/537 |
| 4,795,671 | 1/1989 | Shiiki | 427/96 |

FOREIGN PATENT DOCUMENTS

| 87038 | 8/1983 | European Pat. Off. |
| 0326918 | 1/1989 | European Pat. Off. |
| 0331965 | 9/1989 | European Pat. Off. |

Primary Examiner—Shrive Beck
Assistant Examiner—Vi Duong Dang
Attorney, Agent, or Firm—Connolly & Hutz

[57] ABSTRACT

Circuit boards having excellent electrical and mechanical properties are obtained when special mixtures of polyarylene sulfides and polycarbonates, polyaryl ethers, polyamides, polyesters or rubber elastomers are used as base plates for the wet-chemical deposition of the circuits and the boards are treated with an oxidizing agent before activation.

8 Claims, No Drawings

PROCESS FOR THE METALLIZATION OF MOLDINGS OF POLYARYLENE SULFIDES

This invention relates to a process for the wet-chemical metallization of modified polyarylene sulfides and to the use of the products obtained by this process for the production of electrical circuit boards By virtue of the well-known excellent thermal, mechanical and dielectric properties of polyarylene sulfides in general, numerous attempts have already been made to make these polymers suitable for wet-chemical metallization by suitable pretreatment measures However, the numerous already known processes all have various disadvantages in that they are either too expensive and/or produce inadequate adhesion of the metal coating.

It has now been found that firmly adhering metal coatings can be obtained relatively easily if the moldings consist of polyarylene sulfides containing a) 3 to 40% polycarbonate or polyaryl ether,
b) 2.5 to 15% polyamide or polyester,
c) 2 to 20% of a rubber elastomer, based in each case on the total weight of the polymer mixture.

The special feature of the new process is that it leads to the desired result without the otherwise typical physical pretreatments, such as high-energy irradiation and mechanical roughening.

It is sufficient to expose briefly the surfaces of the moldings to an oxidizing agent which does not etch glass.

Suitable polyarylene sulfides for the production of the polymer mixtures are, in particular, polyphenylene sulfides of the type described in the patent literature discussed above and cited below: U.S. Pat. No. 2,513,188; U.S. Pat. No. 2,538,941; U.S. Pat. No. 3,291,779, preferably U.S. Pat. No. 3,354,129; U.S. Pat. No. 4,038,261; U.S. Pat. No. 4,038,259; U.S. Pat. No. 4,038,263; U.S. Pat. No. 4,038,262; U.S. Pat. No. 4,046,114; U.S. Pat. No. 4,038,260; U.S. Pat. No. 4,116,949; EP-A 56 690, EP-A 119 607 and EP-A 171 021.

These polymers are obtained by methods known per se, more particularly by the reaction of dichlorinated-or polychlorinated aromatic compounds with Na$_2$S in high-boiling solvents.

The following polymers are mentioned by way of example: poly-2,4-tolylene sulfide, polyphenylene sulfide, poly-4,4-biphenylene sulfide and partly branched and/or crosslinked types thereof (cf. for example U.S. Pat. No. 3,324,087) or co-condensates thereof with mono-, di- or polychlorobenzene sulfonic acid, benzoic acid, etc. The last of these polymers is particularly preferred for carrying . out the process according to the invention.

The polycarbonates used as a component of the mixtures are also known compounds and have recurring units corresponding to general formula (I)

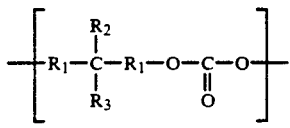

in which each unit —R$_1$— may be selected from the group consisting of phenylene and/or halogen-substituted phenylene and/or alkyl-substituted phenylene and the substituents R$_2$ and R$_3$ may be selected from the group consisting of hydrogen, saturated and unsaturated hydrocarbons. the number of carbon atoms being up to 8. —CH$_3$, —C$_2$H$_5$ and —C$_3$H$_7$ are mentioned by way of example.

According to the invention, polymers based on any aromatic polycarbonates may be used. However, polycarbonates prepared by reaction of bisphenol A (2,2-bis(4-hydroxyphenyl)-propane) are particularly suitable. Polycarbonates based on bis-(4-hydroxyphenyl)-methane, 2,2-bis-(4-hydroxyphenyl)-propane, 2,2-bis-(4-hydroxy-3-methylphenyl)-propane and (3,3,-dichloro-4,4,-dihydroxydiphenyl)-methane may also be used.

The preparation of these polycarbonates is described in the patent literature (cf. for example U.S. Pat. No. 3,028,365 and U.S. Pat. No. 3,275,601). The carbonyl dihalides used for the preparation of the polycarbonates, such as carbonyl dichloride, carbonate esters or haloformates, are generally known. The polycarbonates may of course also be prepared in the presence of acid acceptors, molecular weight regulators and catalysts.

Preferred polymer mixtures a) contain 4 to 20% and, more preferably, 5 to 10% polycarbonate or polyether.

Co- and mixed condensates of aromatic polycarbonates with polysiloxanes are also very suitable. These polymers may contain a polysiloxane component in quantities of from 1 to 40% by weight, preferably in quantities of from 2.5 to 15% by weight and more preferably in quantities of from 2.5 to 10% by weight. Mixed and co-condensates such as these are state of the art.

The polysiloxanes mentioned above predominantly contain recurring units corresponding to general formula (II)

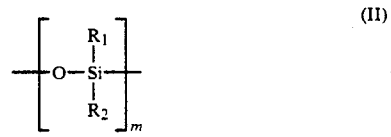

in which each structural unit containing the substituents R$_1$ and R$_2$ may be selected from the group consisting of hydrogen, saturated and/or unsaturated hydrocarbons containing 1 to 8 hydrocarbon atoms, such as —CH$_3$, —CH$_2$H$_5$ and C$_3$H$_7$. The preferred polymer is polydimethyl siloxane In addition, the silicon atoms may contain halogen-substituted and halogen-free or alkyl-substituted phenyl groups. Polysiloxane polymers prepared from phenyl trichlorosilane are also mentioned in this regard.

These polysiloxanes may be prepared, for example, by reaction of chlorinated silanes, such as dichlorosilanes, with water and condensation of the resulting dialkyl silicic acids (which cannot be isolated in the monomeric state) with one another and with alkyl chlorosilanes.

They may of course be prepared from cyclic organosilicon compounds, such as trisiloxane-6-ring or tetrasiloxane-8-ring, in the presence of a base, such as KOH, as initiator. The siloxanes mentioned may contain residues of which the carbon chain may be interrupted by one or more functional groups, such as oxygen atoms. Siloxanes such as these are also known and are described, for example, in DE-A 2 543 638, U.S. Pat.

No. 4,076,695, U.S. Pat. No. 4,472,341 and DE-A 3 600 102.

The following polyaryl ethers are preferably used:

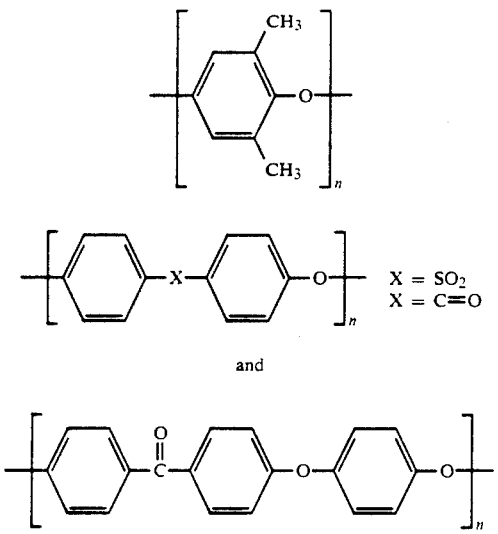

Mixtures and co-condensates of these polyaryl ethers may of course also be used.

The polyamides used as a component of the mixtures are also known compounds and are, in particular, commercially available types, such as polyamide-6, polyamide-6.6, polyamide-10, polyamide-11 and polyamide-12 and also mixtures thereof. Other suitable polyamides are thermoplastic polyamide imides.

In addition, impact-modified commercially available rubber-containing polyamides, preferably based on PA-6 and PA-6.6, are also suitable for carrying out the process according to the invention.

The quantity of polyamide in the resin matrix is preferably from 5 to 10% by weight.

The polyamides used as a component of the mixtures may be obtained in a known manner by polycondensation of aliphatic or aromatic dicarboxylic acids and/or aromatic and aliphatic diols or aromatic or aliphatic hydroxycarboxylic acids.

Terephthalic acid, isophthalic acid, 4,4'-dicarboxyphenyl, 2,6-dicarboxynaphthalene, 1,2-bis-(4-carboxyphenoxy)-ethane and alkyl, aryl, alkoxy and halogen substituents thereof are mentioned as aromatic dicarboxylic acids in this regard.

Suitable aromatic diols are hydroquinones, resorcinol, 4,4'-dihydroxydiphenyl, 4,4'-dihydroxybenzophenone, 4,4'-dihydroxydiphenyl methane, 4,4'-dihydroxydiphenyl ethane, 2,2-bis-(4-hydroxyphenyl)-propane, 4,4'-dihydroxydiphenyl ether, 4,4'-dihydroxydiphenyl sulfone, 4,4'-dihydroxydiphenyl sulfide, 2,6-dihydroxynaphthalene, 1,5-dihydroxynaphthalene and alkyl, aryl, alkoxy or halogen derivatives thereof.

Suitable aromatic hydroxycarboxylic acids are p-hydroxybenzoic acid, m-hydroxybenzoic acid, 2-hydroxynaphthalene-6-carboxylic acid, 1-hydroxynaphthalene-5-carboxylic acid and alkyl, aryl, alkoxy or halogen substituents thereof.

The above-mentioned aliphatic polyesters according to the invention contain recurring units corresponding to formula (I)

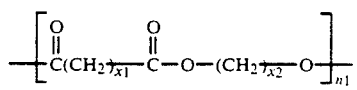

in which $x_1$ and $x_2 = 1$ to 12, preferably 3 to 6 and more preferably 4 to 6.

Polyester carbonates corresponding to general formula (II)

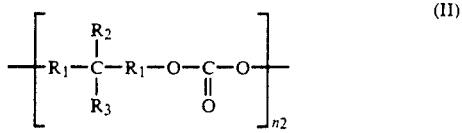

in which
$R_1$ represents optionally chlorine- or $C_{1-4}$-alkyl-substituted phenylene and
$R_2$ and $R_3$ represent H or $C_{1-8}$ alkyl,
may also be used for the production of the blends.

The preferred content by weight of the polyesters in the polymer mixtures is from 5 to 10%.

The rubbers used as a component of the mixtures are known polymers, for example those having a glass transition temperature ($T_G$) of $\leq 5°$ C. and more especially $\leq -20°$ C.

Polyisoprene, polybutadiene and 1,2- and/or 1,4-cis- or trans-isomers thereof are mentioned in this regard.

Rubbers based on 1,5-hexadiene, isobutene and dimethyl siloxane or mixtures thereof are also suitable.

Graft polymers and copolymers of the rubbers mentioned with one another and with acrylonitrile, styrene and acrylates are also suitable.

The graft polymers and copolymers mentioned are known products and are described, for example, in "Kunststoff-Handbuch, IV, R. Vieweg et al., pages 122–145, Carl Hanser Verlag (1969) München".

In addition, the rubbers mentioned may be grafted with polar monomers, such as maleic anhydride or methyl methacrylate, or may be pretreated by oxidation with $Fe^{2+}/M_2O$, perfluoroacetic acid/$H_2O_2$, peroxoacetic acid and thus provided with polar groups (for example OH or COOH).

Particularly preferred mixture components are the halogen-modified, preferably fluorine-containing types. It is pointed out in this regard that the quantity of fluorine, based on the rubber used, cannot be any larger than 20% by weight and preferably 10% by weight.

In addition, special types of the above-mentioned copolymers and graft polymers containing typical UV-screening or absorbing compounds, such as Cyasorb 5411, a benzotriazole UV absorber made by American Cyanamid, or Sanduvor VSU, an oxamide UV absorber made by Sandoz, and—in addition—typical pigments, dyes, mold release agents and lubricants, such as alkali and alkaline earth stearates, are also very suitable.

Preferred polymer mixtures c) contain from 3 to 10% rubber elastomers.

The polyphenylene sulfide blends mentioned show surprisingly low water absorption. This favorable property is surprisingly not adversely affected either by the oxidative pretreatment or by the sensitization or activation.

A further improvement in the adhesion of the metal coating may be obtained by additionally incorporating inorganic, water-insoluble, electrically insulating fillers in the polymer blends. By water-insoluble we mean a solubility of $\leq 4.5$, preferably $\leq 3.5$ and more preferably $\leq 0.25$ g (filler)/1,000 g ($H_2O$).

PPS fillers suitable for carrying out the process are metal salts, metal oxides and mineral fillers except C fibers, Kevlar, aramide, glass and quartz. They may have an average particle size of from 0.01 to 50 $\mu$m, preferably from 1.0 to 8.0 $\mu$m and more preferably from 2 to 3 $\mu$m. The filler usually makes up from about 1 to 90% by weight, preferably from 7.5 to 40% by weight and more preferably from 10 to 30% by weight of the total weight of PPS and filler.

Metal salts suitable for carrying out the process are carbonates, nitrates, nitrites, sulfides, sulfites, sulfates, hydroxides, halides in various stages of oxidation of the elements barium, bismuth, silver, cadmium, cobalt, copper, nickel, lead, tin, magnesium, manganese, iron and zinc. Acetates, orthophosphates, pyrophosphates or thiocyanates of the above-mentioned metals may also be used for carrying out the process.

Particularly suitable fillers are CuS, NiS, $BaSO_4$, $TiO_2$, $BaF_2$, $BaIO_3$, $Cd(OH)_2$, $FeCO_3$, $Fe(OH)_2$, $Fe(OH)_3$, $Co(OH)_2$, $CuCN_2$, AgCl, $MgCl_2$, $Mg_2P_2O_7$ and mixtures thereof. Oxides of the metals aluminium, antimony, bismuth, cerium, cobalt, copper, gallium, manganese, magnesium, germanium, indium, iron, lead, nickel, tin, zinc, may be used to carry out the process. $SiO_2$, $Al_2O_3$, MnO, $MnO_2$, MgO, BaO are mentioned in this regard.

Suitable oxidizing agents for carrying out the process according to the invention are, preferably, 2% aqueous $Br_2$ solutions, concentrated $H_2SO$ (density=1.84 g/cm$^3$) or chromosulfuric acid consisting of, for example, 0.1 to 30 g/l $Na_2Cr_2O$; or consisting of, for example, 0.1 to 40 g/l $Na_2Cr_2O_7$, 200 ml $H_2O_{dist.}$, 600 ml $H_2SO_{4conc.}$ and 200 ml $H_3PO_{4conc.}$, or organic peracids, such as

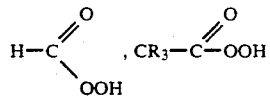

F or peroxobenzenesulfonic acid, benzenesulfonic acid and $H_2O_2$ or $H_2O_2$ in hexafluoro- or trifluoroacetone.

The treatment may be carried out at a temperature in the range from $-15°$ C. to the particular boiling point of the oxidation medium mentioned, preferably at a temperature in the range from $+15$ to $+60°$ C. and more preferably at a temperature in the range from $+15°$ C. to $+40°$ C. over a period of 0.5 to 90 minutes, preferably over a period of 1 to 10 minutes and more preferably over a period of 5 to 7 minutes.

Using the metal coatings applied by the process according to the invention, injection-molded circuit boards may be produced both by the known semi-additive process and by the full-additive process.

For the production of circuit boards by the full-additive process, the moldings are optionally provided with holes, treated with the oxidizing agents mentioned, activated, optionally sensitized and then provided with a mask based on screen printing pastes or photolacquers, after which a 5 to 40 $\mu$m thick metal coating is wet-chemically deposited onto the mask-free areas.

In the application of the process on an industrial scale, the timing of the masking step (i.e. before or after activation or sensitization) may of course be varied as required. It is mentioned in this regard that the adhesion of the metal coating is surprisingly improved to a considerable extent by the oxidative pretreatment and, optionally, by subsequent conditioning.

Preferred metal coatings are copper coatings.

For the production of circuit boards by the semiadditive process, the moldings are optionally provided with holes, metallized with a 0.1 to 10 $\mu$m and preferably 0.5 to 2 $\mu$m thick metal coating by the method already subsequently provided with a mask based on a screen printing paste or photolacquer, as mentioned above. The mask-free areas are thickened to 12 to 70 $\mu$m and preferably to 17.5 to 40 $\mu$m and the mask is chemically or mechanically removed from the surface, after which the electrically conductive metal coating is removed from the substrate surface, preferably by differential etching. Typical metals, such as Ni, Cu, Co, Ag and Au or mixtures thereof may be used for the electroplating step. The preferred metal is copper.

The activation step which precedes metallization—optionally after a "detoxification" step, for example with a bisulfite solution—is carried out with typical colloidal or ionic activation systems, preferably based on palladium.

In addition, organometallic complex compounds of noble metals, of the type described for example in EP-A 81 129 and 82 438 and in U.S. Pat. No. 4,636,441 and 4,006,047 and in DE-A 2 116 389 and 2 451 217, are particularly suitable as activators. Pd complexes are preferred.

If desired, the activation step may be followed by sensitization with $SnCl_2$ or $ZnCl_2$ solutions.

The baths described in detail in the literature and, above all, commercially available baths are suitable for the metallization step. After metallization, conditioning at a temperature in the range from the glass transition temperature to the softening point, i.e. in the range from about 90° to 250° C. and preferably in the range from 120° to 170° C., is often advisable. The conditioning time may be varied within wide limits and is preferably from 40 to 80 minutes.

The metal composite materials obtainable in accordance with the invention have a metal coating according to DIN 53 496 of at least 10 N/inch, normally from 50 to 30 N/inch and, in special cases, from 35 to 60 N/inch. These materials are distinguished by their high thermal conductivity and excellent shielding effect against troublesome electromagnetic radiation. They may be used both in the automotive industry and also in the electrical and electronics industry.

The new process is used with particular preference for the production of extremely fine circuit boards having conductor widths of $\leq 200$ $\mu$m by the differential etching method.

In the following Examples, "PPS" stands for polyphenylene sulfide and "PA" for polyamide.

EXAMPLE 1a

An injection-molded PPS/PC board (95% PPS containing 5 polycarbonate) (150×150×2 mm) is pretreated for 5 minutes at room temperature in a bath consisting of 8.5 g $Na_2Cr_2O$; and 100 ml $H_2SO_4$ ($\rho$=1.84 g/cm$^3$), washed with $H_2O_{dist.}$, dried, activated for 5 minutes at room temperature in a solution consisting of 0.5 g mesityl oxide palladium chloride and 1,000 ml $CCl_2=CCl_2$, dried, sensitized in a solution consisting of 1.0 g NaOH, 8.0 g DMAB (dimethylaminoborane) and 1,000 ml H₂O$_{dist.}$, washed with H₂O$_{dist.}$ and then treated in an Ni bath (Schering AG, 1000 Berlin) for 30 minutes to form an Ni coating. The board is then conditioned for 1 h at 150° C.

A composite material showing good metal adhesion is obtained. The adhesion of the metal coating, as determined by the take-off force in accordance with DIN 53 496, measures ≧30 N/25 mm.

The thickening of the PPS board by electroplating for determining the take-off force was carried out as follows:

a) pickling for 30 seconds in 10% H₂SO₄
b) rinsing
c) 5 minutes in a semi-bright nickel bath, voltage 3 volts, bath temperature 60° C.
d) rinsing
e) pickling for 30 seconds,
f) 90 minutes in a copper bath, voltage 1.3 volts, bath temperature 28° C.
g) rinsing.

The metal coating passes the solder bath test.

The board thus produced is provided with a partial mask (screen printing process), the mask-free areas are thickened to 40 μm by electroplating, the mask is removed from the PPS surface in CH₂Cl₂ and the remaining Ni coating is removed from the surface by differential etching in a bath consisting of 3 g FeCl₂, 15 ml HCl and 500 ml H₂O$_{dist.}$. An injection-molded circuit board having excellent electrical and thermal properties is obtained.

EXAMPLE 2a

A PPS board of the type described in Example 1a is pretreated for 5 minutes at room temperature in a solution consisting of 250 ml

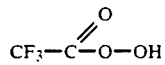

and 100 ml H₂O$_{dist.}$, washed with H₂O$_{dist.}$, activated in a bath consisting of 1.0 g bisbenzonitrile palladium chloride and 1,000 ml

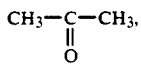

dried and then sensitized as in Example 1.

The board is then copper-plated for 50 minutes in a commercially available copper bath (Shiplay AG, D-7000 Stuttgart) and provided with circuits by differential etching as in Example 1 using a photoresist (BASF AG). The board subsequently conditioned at 170° C. has a metal adhesion of ≧30 N/inch. The metal coating adheres to the PPS surface so firmly that it passes the solder bath test.

Tracking resistance is good.

EXAMPLE 3a

A 15% glass-fiber-reinforced PPS/PC board (PPS content 80%) additionally containing 10% MgO is pretreated for 5 minutes at 80° C. in a solution consisting of 5 g CrO₃ and 1,000 ml H₂SO₄ (ρ=1.84 g/cm³), activated in a colloidal activator (Blasberg AG, D-5650 Solingen) and then metallized and provided with circuits as in Example 2. A circuit board having good metal adhesion (≧17.5 N/inch) is obtained. The circuits pass the solder bath test and the board shows good tracking resistance.

EXAMPLE 4a

A 20% glass-fiber-reinforced PPS/PC board (93% PPS) is pretreated in a bath consisting of 2 g Br₂ and 1,000 ml H₂O$_{dist.}$, washed and then activated with an ionic activator consisting of 1 g PdCl₂, 10 g HCl (37%) and 1,000 ml H₂O$_{dist.}$ and sensitized as in Example 1. The board is then provided with a partial mask (screen printing process), provided with a 15 μm thick coating of copper in a chemical metallizing bath and then conditioned for 1 hour at 160° C.

A circuit board produced by the full-additive process which shows good metal adhesion is obtained. This circuit board can be soldered in standard solder baths at up to about 260° C.

EXAMPLE 5a

A circuit board according to Example 1a is pretreated in a bath consisting of 5 g Na₂Cr₂O₇, 600 g H₂SO₄$_{conc.}$ and 150 g H₃PO₄$_{conc.}$, washed and dried with an activating solution consisting of 0.2 g Na₂PdCl₄, 0.8 g 1,4,7,10,13-pentaoxycyclododecane and 1,000 ml CCl₃-CH₃, partially activated by spraying at room temperature and sensitized in accordance with Example 1, metallized in accordance with Example 2 and conditioned.

A circuit board produced by the full-additive process having a metal adhesion of ≧25 N/inch is obtained. The metal coating easily passes the solder bath test.

EXAMPLE 6a

A 150×150×2 mm glass-fiber-reinforced PPS/PC board (80% PPS) is treated for 15 minutes in a bath consisting of 1,000 ml CF₃COOH and 750 ml H₂O₂, washed with H₂O$_{dist.}$, dried, activated for 5 minutes in a bath consisting of 1,000 ml ethanol, 2 g AlCl₃ and 1 g bis-benzonitrile palladium(II) chloride, washed with H₂O$_{dist.}$ and then provided with a 1 μm thick Cu coating in a chemical copper plating bath (Schering AG, D-1000 Berlin), the Cu coating thus applied is thickened to 40 μm by electroplating and the board subsequently conditioned for 1 h at 170° C.

A composite board characterized by very good metal adhesion is obtained.

EXAMPLE 7a

A 300×100×3 mm glass-fiber-reinforced PPS/PC board (90% PPS) is oxidatively treated as in Example 6a, activated and metallized as in Example 6, the metal coating is thickened to 40 μm by electroplating with Ni and then conditioned for 90 minutes at 135° C.. A composite board characterized by very good metal adhesion and tracking resistance is obtained.

EXAMPLE 1b

A 100×100×2 mm injection-molded resin board consisting of 85% by weight PPS and 15% by weight PA-6 (Bayer Ag, 5090 Leverkusen 1) is pretreated for 5 minutes at room temperature in a bath consisting of 8.5 g Na₂Cr₂O₇ and 1,000 ml H₂SO₄ (ρ=1.84 g/cm³), washed with H₂O$_{dist.}$, dried, activated for 5 minutes at room temperature in a solution consisting of 0.5 g mesityl oxide palladium chloride and 1,000 ml CCl₂=CCl₂, dried, sensitized in a solution consisting of 1.0 g NaOH, 8.0 g DMAB (dimethyl aminoborane) and 1,000 ml H₂O$_{dist.}$, washed with H₂O$_{dist.}$ and then treated for 30 minutes in an Ni bath (Schering AG, 1000 Berlin) to form an Ni coating. The board is then conditioned for 1 hour at 150° C.

A composite material characterized by good metal adhesion is obtained. The adhesion of the metal coating, as determined by the take-off force in accordance with DIN 53 496, measures $\geqq 30$ N/25 mm.

Thickening of the above PPS board by electroplating to measure the take-off force was carried out as follows:
a) pickling for 30 seconds in 10% $H_2SO_4$
b) rinsing
c) 5 minutes in a semi-bright nickel bath, voltage 3 volts, bath temperature 60° C.
d) rinsing
e) pickling for 30 seconds
f) 90 minutes in a copper bath, voltage 1.3 volts, bath temperature 28° C.
g) rinsing.

The metal coating passes the solder bath test.

The board thus produced is provided with a partial mask (screen printing process), the mask-free areas are thickened to 40 μm by electroplating, the mask is removed from the PPS surface in $CH_2Cl_2$ and the remaining Ni coating is removed from the surface by differential etching in a bath consisting of 3 g $FeCl_2$, 15 ml HCl and 500 ml $H_2O_{dist.}$. An injection molded circuit board having excellent electrical and thermal properties, such as tracking resistance and flexural strength, is obtained.

The board easily passes the standard solder bath test.

EXAMPLE 2b

An injection-molded resin board consisting of 85% by weight PA-6,6 is pretreated for 7.5 minutes at 40° C. in a bath consisting of 1,000 g $H_2SO_4$ ($\rho = 1.84$ g/cm$^3$) and 100 g $H_2O_{dist.}$. Activation, application of the electrically conductive metal coating and development of the circuits are carried out as in Example 1b.

An injection-molded 3D circuit board having excellent tracking resistance and solder bath resistance is obtained. The adhesion of the metal coating (take-off force) measures approx. 37 N/25 mm.

EXAMPLE 3b

A resin board according to Example 1b additionally containing 10% by weight $CaCO_3$, is pretreated for 5 minutes at room temperature in a solution consisting of 250 ml

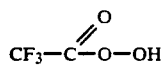

and 100 ml $H_2O_{dist.}$, washed with $H_2O_{dist.}$, activated in a bath consisting of 1.0 g bis-benzonitrile palladium chloride and 1,000 ml

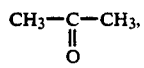

dried and then sensitized as in Example 1b.

The board is then copper-plated for 50 minutes in a commercially available copper bath (Shiplay AG, D-7000 Stuttgart) and provided with circuits by differential etching as in Example 1 using a photoresist (BASF AG). The board subsequently conditioned at 170° C. has a metal adhesion of $\geqq 30$ N/inch. The metal coating adheres to the PPS surface so firmly that it passes the solder bath test.

Tracking resistance is excellent.

EXAMPLE 4b

A 15% glass-fiber-reinforced PPS-PA-6,6 board (elastomer-modified type, Bayer AG, 5090 Leverkusen; with a PPS content of 90%; based on the resin as a whole) additionally containing $CaCO_3$ (10%), is pretreated for 5 minutes at room temperature in a solution consisting of 5 g $CrO_3$ and 1,000 ml $H_2SO_4$ ($\rho = 1.84$ g/cm$^3$), activated in a colloidal activator (Blasberg AG, D-5650 Solingen) and then metallized and provided with circuits as in Example 2. A circuit board having good metal adhesion ($\geqq 27.5$ N/inch) is obtained The circuits pass the solder bath test.

This board is distinguished by its excellent tracking resistance.

EXAMPLE 5b

A conventional, 15% glass-fiber-reinforced PPS Ultem board containing 70% PPS is pretreated for 5 minutes at 80° C. in a solution consisting of 5 g $CrO_3$ and 1,000 ml $H_2SO_4$ ($\rho = 1.84$ g/cm$^3$), activated in a colloidal activator (Blasberg AG, D 5650 Solingen) and then metallized and provided with circuits as in Example 2b. A circuit board having good metal adhesion ($\geqq 25$ N/inch) is obtained. The circuit boards pass the solder bath test. The board shows excellent tracking resistance.

EXAMPLE 6b

A 45% glass-fiber-reinforced PPS blend containing 10% PA-11 is pretreated in a bath consisting of 2 g $Br_2$ and 1,000 ml $H_2O_{dist.}$, washed, activated with an ionic activator consisting of 1 g $PdCl_2$, 10 g HCl(37%) and 1,000 ml $H_2O_{dist.}$ and sensitized as in Example 1b. The board is subsequently provided with a partial mask (screen printing process), provided with a 15 μm thick copper coating in a chemical metallizing bath and then conditioned for 1 hour at 160° C.

A circuit board produced by the full-additive process characterized by good metal adhesion is obtained. The circuit board may be soldered in standard solder baths at approximately 260° C.

EXAMPLE 7b

A circuit board according to Example 1b is pretreated in a bath consisting of 5 g $Na_2Cr_2O_7$, 600 g $H_2SO_{4conc.}$ and 150 g $H_3PO_{4conc.}$, washed and dried, partially activated by spraying at room temperature with an activating solution consisting of 0.2 g $Na_2PdCl_4$, 0.8 g 1,4,7,10,13-pentaoxycyclododecane and 1,000 ml $CCl_3-CH_3$, sensitized as in Example 1b and then metallized and conditioned as in Example 2.

A circuit board produced by the full-additive process characterized by a metal adhesion of $\geqq 30$ N/inch is obtained. The metal coating easily passes the solder bath test. The board is distinguished by its excellent tracking resistance and low water absorption.

EXAMPLE 8b

A 300×100×3 mm board consisting of 30% by weight glass fibers (3 mm) and PPS-PA.6 blend (85% COOH-terminated PPS having an average molecular weight of 25,000) is treated for 15 minutes in a bath consisting of 1,000 ml $CF_3COOH$ and 750 ml $H_2O_2$, washed with $H_2O_{dist.}$, dried, activated for 5 minutes in a bath consisting of 1 g bis-benzonitrile palladium(II) chloride and 1,000 ml $CH_2Cl_2$, washed with $H_2O_{dist.}$, provided with a 1 μm thick Cu coating in a chemical copper plating bath (Schering AG, D-1000 Berlin), after which the Cu coating is thickened to 40 μm by electroplating and the board subsequently conditioned for 1 h at 170° C.

A composite board having very good metal adhesion is obtained. It is distinguished by surprisingly good tracking resistance and electrical resistance.

EXAMPLE 9b

A 300×100×3 mm PPS-PA blend board according to Example lb additionally containing 5% by weight CaCO$_3$ and 10% by weight glass fibers (3 mm) is oxidatively treated as in Example 6b, activated and metallized, the metal coating is thickened to 40 μm by electroplating with Ni and the board is subsequently conditioned for 90 minutes at 135° C. A composite board having very good metal adhesion is obtained.

EXAMPLE 10b

A 300×100×3 mm PPS-APEC board (cf. product specification of Bayer AG, order no. CU 96 277, edition 7; 8 D 1-877/846994) containing 85% by weight PPS is pretreated as in Example lb and then provided with a metal coating. A composite board having very good metal adhesion is obtained, easily passing the solder bath test (10 seconds at 260° C. in a conventional solder bath).

EXAMPLE 11b

An injection-molded resin board consisting of 85% by weight PPS and 15% by weight polyester based on adipic acid and butanediol (Bayer AG, 5090 Leverkusen is metallized as in Example lb. A composite material having good metal adhesion of >30 N/inch is obtained. This board easily passes the solder bath test.

EXAMPLE 1c

A 150×150×2 mm injection-molded board of PPS/rubber blend (85% PPS and 15% polyisoprene-based rubber) is pretreated for 5 mins at room temperature in a bath consisting of 7.0 g Na$_2$Cr$_2$O$_7$ and 1,000 ml H$_2$SO$_4$ (ρ=1.84 g/cm$^3$), washed with H$_2$O$_{dist.}$, dried, activated for 5 minutes at room temperature in a solution consisting of 0.5 g mesityl oxide palladium chloride and 1,000 ml CCl$_2$=CCl$_2$, dried, sensitized in a solution consisting of 1.0 g NaOH, 8.0 g DMAB (dimethylaminoborane) and 1,000 ml H$_2$O$_{dist.}$, washed with H$_2$O$_{dist.}$ and then treated for 30 minutes in an Ni bath (Schering AG, 1000 Berlin) to form an Ni coating.

A composite material characterized by good metal adhesion is obtained. The adhesion of the metal coating, as determined by the take-off force in accordance with DIN 53 496, measures ≧25 N/25 mm.

Thickening of the above PPS/rubber blend board by electroplating to measure the take-off force was carried out as follows:

a) pickling for 30 seconds in 10% H$_2$SO$_4$
b) rinsing
c) 5 minutes in a semi-bright nickel bath, voltage 3 volts, bath temperature 60° C.
d) rinsing
e) pickling for 30 seconds,
f) 90 minutes in a copper bath, voltage 1.3 volts, bath temperature 28° C.
g) rinsing The metal coating passes the solder bath test.

The board thus produced is provided with a partial mask (screen printing process), the mask-free areas are thickened to 40 μm by electroplating, the mask is removed from the blend surface in CH$_2$Cl$_2$ and the remaining Ni coating is removed from the surface by differential etching in a bath consisting of 3 g FeCl$_2$, 15 ml HCl and 500 ml H$_2$O$_{dist.}$. An injection molded circuit board having excellent electrical and thermal properties, such as tracking resistance and flexural strength, is obtained.

The board easily passes the standard solder bath test.

EXAMPLE 2c

A resin board according to Example 1c additionally containing 10% by weight TiO$_2$ is pretreated for 5 minutes at room temperature in a solution consisting of 250 ml

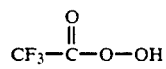

$$CF_3-C(=O)-O-OH$$

and 100 ml H$_2$O$_{dist.}$, washed with H$_2$O$_{dist.}$, activated in a bath consisting of 1.0 g bis-benzonitrile palladium chloride and 1,000 ml

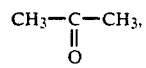

$$CH_3-C(=O)-CH_3,$$

dried and then sensitized as in Example 1.

The board is then copper-plated for 50 minutes in a commercially available copper bath (Shiplay AG, D-7000 Stuttgart) and provided with circuits by differential etching as in Example 1 using a photoresist (BASF AG). The board has a metal adhesion of ≧25 N/inch. The metal coating adheres to the surface of the board so firmly that it passes the solder bath test.

The tracking resistance of this circuit board is good.

EXAMPLE 3c

A 15% glass-fiber-reinforced PPS/PC board (PPS content 80%, based on the resin as a whole) additionally containing 10% MgCO$_3$ is pretreated for 5 minutes at 80° C. in a solution consisting of 5 g CrO$_3$ and 1,000 ml H$_2$SO$_4$ (ρ=1.84 g/cm$^3$), activated in a colloidal activator (Blasberg AG, D-5650 Solingen) and then metallized and provided with circuits as in Example 2c. A circuit board having good metal adhesion (≧27.5 N/inch) is obtained. The circuits pass the solder bath test.

The rubber used is a crosslinked graft copolymer based on 1,4-butadiene and acrylonitrile containing ~20% by weight acrylonitrile.

EXAMPLE 4c

A 20% glass-fiber-reinforced rubber-modified PPS board (83% PPS and 17% rubber-containing blend) is pretreated in a bath consisting of 7 g Na$_2$Cr$_2$O$_7$, 100 g H$_3$PO$_4$ (ρ=1.34 g/cm$^3$), 180 g H$_2$SO$_4$ (ρ=1.84 g/cm$^3$) and 780 g H$_2$O$_{dist.}$, washed, activated with an ionic activator consisting of 1 g PdCl$_2$, 10 g HCl (37%) and 1,000 ml H$_2$O$_{dist.}$ and sensitized as in Example 1c. The board is then provided with a partial mask (screen printing process) and provided with a 15 μm thick Cu coating in a chemical metallizing bath.

A circuit board produced by the full-additive process characterized by good metal adhesion and tracking resistance is obtained. This circuit board can be soldered in conventional solder baths at approximately 260° C. The rubber used is a graft polymer based on crosslinked 1,4-polyisoprene and methyl acrylate.

EXAMPLE 5c

A circuit board according to Example 1c is pretreated for 15 minutes at 65° C. in a bath consisting of 5 g $Na_2Cr_2O_7$, 100 g $H_2SO_{4conc.}$, 150 g $H_3PO_{4conc.}$, 750 g $H_2O_{dist.}$, washed, dried, partially activated by spraying at room temperature with an activating solution consisting of 0.2 g $Na_2PdCl_4$, 0.8 g 1,4,7,10,13-pentaoxycyclododecane and 1,000 ml $CCl_3$-$CH_3$, sensitized as in Example 1c and then metallized and conditioned as in Example 2.

A circuit board produced by the full-additive process characterized by a metal adhesion of $\geq 35$ N/inch and excellent tracking resistance is obtained. The metal coating easily passes the solder bath test.

EXAMPLE 6c

A $150 \times 150 \times 2$ mm rubber-modified PPS board consisting of 60% by weight PPS, 20% by weight rubber and 20% by weight glass fibers (3 mm) and COOH-terminated PPS having an average molecular weight of 25,000, is treated for 15 minutes in a bath consisting of 1,000 ml $CF_3COOH$ and 750 ml $H_2O_2$, washed with $H_2O_{dist.}$, dried, activated for 5 minutes in a bath consisting of 1,000 ml ethanol, 2 g $AlCl_3$ and 1 g bis-benzonitrile palladium(II) chloride, washed with $H_2O_{dist.}$ and then provided with a 1 μm thick Cu coating in a chemical copper plating bath (Schering AG, D-1000 Berlin), after which the Cu coating is thickened to 40 μm by electroplating and the board subsequently conditioned for 1 hour at 170° C.

A composite board having very good metal adhesion is obtained.

What is claimed is:

1. A process for the wet-chemical metallization of moldings of polyarylene sulfides, characterized in that the moldings are exposed before activation to an oxidizing agent which does not etch glass and in that the moldings consist of polyarylene sulfides and a modifier selected from
   a) 3 to 40% polycarbonate or polyaryl ether,
   b) 2.5 to 15% polyamide or polyester, or
   c) 2 to 20% of a rubber elastomer, based in each case on the total weight of the polymer mixture.
2. A process as claimed in claim 1, characterized in that the content by weight of polycarbonate or polyaryl ether is from 5 to 10%.
3. A process as claimed in claim 1, characterized in that the content by weight of polyamide or polyester is from 5 to 10%.
4. A process as claimed in claim 1, characterized in that the content by weight of rubber is from 3 to 10%.
5. A process as claimed in claim 1, characterized in that organometallic complex are used for activation.
6. A process as claimed in claim 1, characterized in that bromine solutions, conce sulfuric acid or chromosulfuric acid or mixtures thereof with phosphoric acid or organic peracids are used as the oxidizing agent.
7. A process as claimed in claim 1, characterized in that the moldings are partially metallized to build up electrical circuit boards by the or semi-additive process.
8. Circuit boards obtained by the process claimed in claim 7.

* * * * *